United States Patent
Nagashima

(10) Patent No.: US 9,445,513 B2
(45) Date of Patent: Sep. 13, 2016

(54) DISPLAY DEVICE

(71) Applicant: NAGASHIMAKOUGEI CO., LTD., Kasukabe-shi, Saitama (JP)

(72) Inventor: Yoichi Nagashima, Kasukabe (JP)

(73) Assignee: NAGASHIMAKOUGEI CO., LTD., Kasukabe-shi (JP)

( * ) Notice: Subject to any disclaimer, the term of this patent is extended or adjusted under 35 U.S.C. 154(b) by 40 days.

(21) Appl. No.: 14/390,887

(22) PCT Filed: Mar. 29, 2013

(86) PCT No.: PCT/JP2013/059614
§ 371 (c)(1),
(2) Date: Oct. 6, 2014

(87) PCT Pub. No.: WO2013/150980
PCT Pub. Date: Oct. 10, 2013

(65) Prior Publication Data
US 2015/0173216 A1 Jun. 18, 2015

(30) Foreign Application Priority Data
Apr. 5, 2012 (JP) .................................. 2012-086326

(51) Int. Cl.
| H05K 5/02 | (2006.01) |
| G06F 1/16 | (2006.01) |
| H04M 1/02 | (2006.01) |
| H05K 5/00 | (2006.01) |

(52) U.S. Cl.
CPC ........... *H05K 5/0217* (2013.01); *G06F 1/1647* (2013.01); *H04M 1/0239* (2013.01); *H05K 5/0017* (2013.01); *H05K 5/02* (2013.01)

(58) Field of Classification Search
CPC .... H05K 5/0017; H05K 5/02; H05K 5/0217; G06F 1/1647; H04M 1/0239
See application file for complete search history.

(56) References Cited

U.S. PATENT DOCUMENTS

| 8,630,085 B2 * | 1/2014 | Sawada ............... | H04M 1/0237 345/169 |
| 2010/0188350 A1 * | 7/2010 | Sawada ............... | H04M 1/0237 345/173 |
| 2013/0012273 A1 * | 1/2013 | Sato ...................... | G06F 1/1624 455/566 |

FOREIGN PATENT DOCUMENTS

| JP | 2002-099226 A | 4/2002 |
| JP | 2003-158573 A | 5/2003 |

(Continued)

OTHER PUBLICATIONS

May 7, 2013 International Search Report issued in Application No. PCT/JP2013/059614.

(Continued)

*Primary Examiner* — Hoa C Nguyen
*Assistant Examiner* — Keith Depew
(74) *Attorney, Agent, or Firm* — Oliff PLC

(57) ABSTRACT

A display device includes: a first display part having a first screen; a second display part having a second screen; a casing which accommodates the first and second display parts, therein. A first display part area accommodates the first display part and a second display part area accommodates the second display part, which are formed in the casing. The movement mechanism includes a first in-plane direction rail which allows the first display part to move in the X-direction; and a second vertical direction rail, which allows the second display part to move in the Z-direction. The first in-plane direction rail allows the first display part area to move between the first display part and a neighboring area which is disposed adjacent to the first display part. The second vertical direction rail allows the second display part to move between the second display part and the first display part areas.

2 Claims, 18 Drawing Sheets

(56) References Cited

FOREIGN PATENT DOCUMENTS

| JP | 2008-301244 A | 12/2008 |
|---|---|---|
| WO | 2009/034907 A1 | 3/2009 |
| WO | 2009/075260 A1 | 6/2009 |

OTHER PUBLICATIONS

May 7, 2013 Written Opinion issued in Application No. PCT/JP2013/059614.

* cited by examiner

Fig. 6
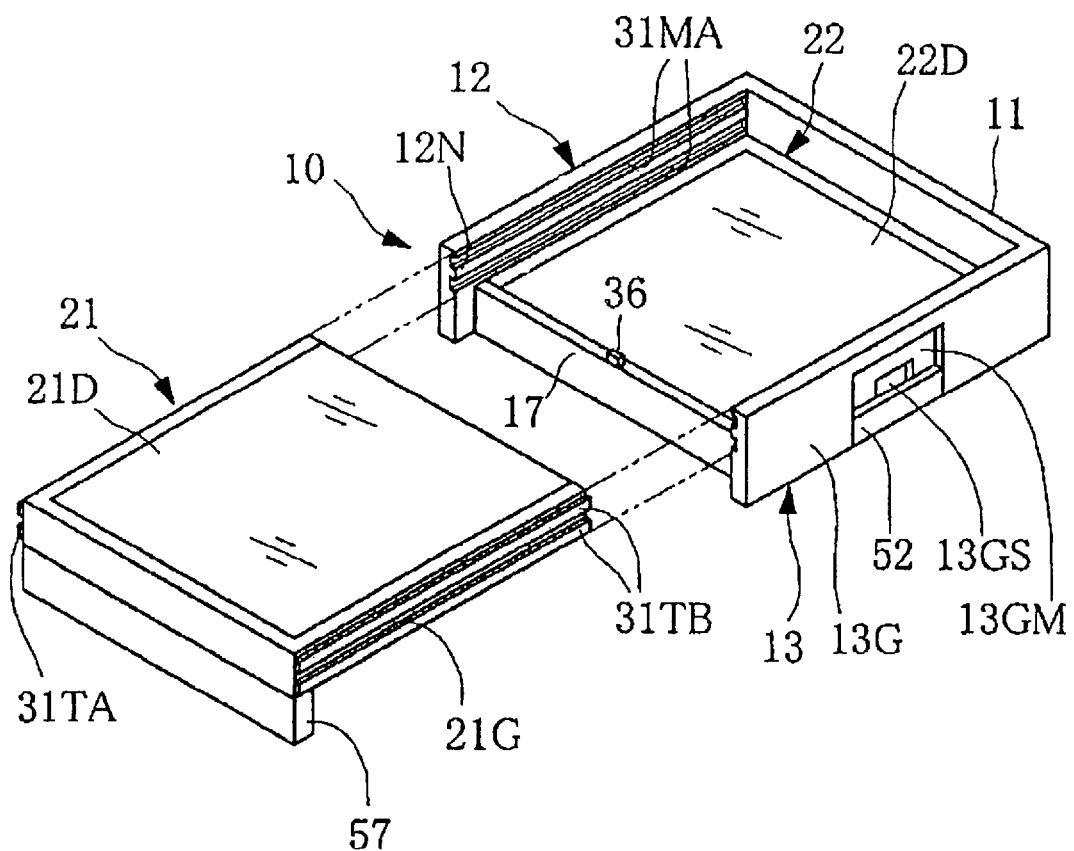
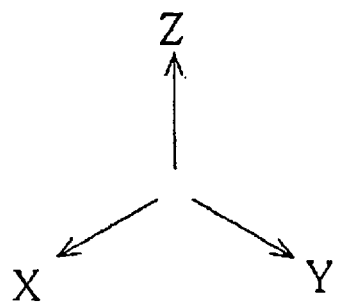

DISPLAY DEVICE

TECHNICAL FIELD

The present invention relates to a display device.

BACKGROUND ART

Recent years, as an information processing device, there has been proposed an information processing device which exhibits excellent portability (hereinafter referred to as "portable information processing device") such as a notebook type personal computer or a mobile phone. Such a portable information processing device has been miniaturized for enhancing portability of the device.

However, since the number of functions which the portable information processing device possesses has been steadily increased, there has been a demand for a display device (liquid crystal display or the like) having a screen of a larger size. Accordingly, a portable information processing device of recent years is required to satisfy both the miniaturization of the device per se and the large-sizing of a screen of a display device.

A portable information processing device disclosed in patent literature 1 includes: a first display having a first screen; a second display having a second screen; and a hinge which connects the first display and the second display to each other in an openable and closable manner. In such an information processing device, using such a hinge, the first display and the second display are openable and closable between an in-use state where the first screen and the second screen are arranged on the same plane and an accommodated state where the first screen and the second screen are folded up.

CITATION LIST

Patent Literature

PTL 1: JP-A-2003-158573

SUMMARY OF INVENTION

Technical Problem

However, in the information processing device disclosed in patent literature 1, in performing a manipulation of opening and closing the respective displays, such a manipulation requires a larger space than the actual device per se.

The present invention has been made in view of the above-mentioned circumstances, and it is an object of the present invention to provide a display device which is applicable to a portable information processing device.

Solution to Problem

The present invention is directed to a display device which includes: a first display part having a first screen; a second display part having a second screen; a casing which holds the first display part and the second display part therein; and a movement mechanism for making the first display part and the second display part movable between an overlapping state where the first screen and the second screen are held in the casing in a posture where the first screen and the second screen overlap with each other, are arranged parallel to each other and are directed in the same direction, and a developed state where the first screen and the second screen are held in the casing in a posture where the first screen and the second screen are contiguously arranged with each other. In the overlapping state, a space where the first display part is positioned is defined as a first display part existing area, and a space where the second display part is positioned is defined as a second display part existing area. In the developed state, when a space where the first display part is positioned is defined as a first display part movement destination area, and a space where the second display part is positioned is defined as a second display part movement destination area, the second display part movement destination area wholly overlaps with the first display part existing area. In the overlapping state, the first display part is positioned in an upper portion of the casing, and the second display part is positioned in a lower portion of the casing. The movement mechanism includes: a first in-plane direction rail which is provided between the casing and the first screen, and allows the first display part to move between the first display part existing area and the first display part movement destination area only by sliding of the first display part in a planar direction including the first screen; and a second vertical direction rail which is provided between the casing and the second screen, is disposed on a side closer to the first display part existing area than a first display part existing area side end portion of the first display part positioned in the first display part movement destination area, and allows the second display part to move between the second display part existing area and the second display part movement destination area only by sliding of the second display part in a direction perpendicular to the second screen. The first display part and the second display part are transferred to the developed state from the overlapping state by the sliding movement of the first display part in the planar direction from the first display part existing area to the first display part movement destination area and by elevation of the second display part in the vertical direction from the second display part existing area to the second display part movement destination area.

It is preferable that a screen end of the first screen extends toward an end of the first display part, and the display device includes a first display part protective member which protects the screen end of the first display part positioned in the first display part accommodating area. Further, it is preferable that the first display part protective member is formed on the casing.

It is preferable that a screen end of the second screen extends toward an end of the second display part, and the display device includes a second display part protective member which protects the screen end of the second display part positioned in the second display part accommodating area. Further, it is preferable that the second display part protective member is formed on the casing or on the first display part.

It is preferable that the first in-plane direction rail does not intersect with the second vertical direction rail. Further, it is preferable that the first in-plane direction rail is formed on either one of the inside and the outside of the casing, and the second vertical direction rail is formed on the other of the inside and the outside of the casing. Still further, it is preferable that the first display part has a first rightly-facing surface which rightly faces to the second display part positioned in the second display part accommodating area when the first display part is positioned in first display part accommodating area, and the second display part has a second rightly-facing surface which rightly faces to the first display part positioned in the first display part accommodating area when the second display part is positioned in the second display part accommodating area, and a projection is formed on either one of the first rightly-facing surface and the second rightly-facing surface, and a projection supporting part which supports the projection is formed in the other of the first rightly-facing surface and the second rightly-facing surface.

The present invention is also directed to a display device which includes: a first display part having a first screen; a second display part having a second screen; a casing which accommodates the first display part and the second display part therein; and a movement mechanism for making the first display part movable between an overlapping state where the first screen and the second screen are accommodated in the casing in a posture where the first screen and the second screen overlap with each other, are arranged parallel to each other and are directed in the same direction, and a state where the first screen and the second screen are contiguously arranged with each other. In the overlapping state, the first display part is positioned in an upper portion of the casing, and the second display part is positioned in a lower portion of the casing. The casing includes: a first casing in which a first display part accommodating area for accommodating the first display part is formed; and a second casing in which a second display part accommodating area for accommodating the second display part and a first casing accommodating area for accommodating the first casing are formed. The movement mechanism includes: a first in-plane direction rail which is provided between the first casing and the first screen, and allows the first display part to move only in a planar direction including the first screen; and a first vertical direction rail which is provided between the first casing and the second casing, and allows the first display part to move together with the first casing only in a direction perpendicular to the first screen. The first in-plane direction rail allows the first display part to move in the planar direction between the first display part accommodating area and a first neighboring area arranged adjacent to the first display part accommodating area in the planar direction. The first vertical direction rail allows the first display part, the first casing and the first in-plane direction rail to collectively move in the vertical direction such that the first display part is transferable between the first neighboring area and a second neighboring area arranged adjacent to the second display part accommodating area in the planar direction.

Advantageous Effects of Invention

According to the above-mentioned display device, a manipulation in an in-use state and a manipulation in an accommodated state can be performed within a small space.

BRIEF DESCRIPTION OF DRAWINGS

FIG. 6 is an exploded perspective view showing the overall structure of the portable information processing device.

DESCRIPTION OF EMBODIMENTS

Hereinafter, embodiments of the present invention are explained by reference to attached drawings.

Firstly, a first embodiment is explained.

Figure 1:
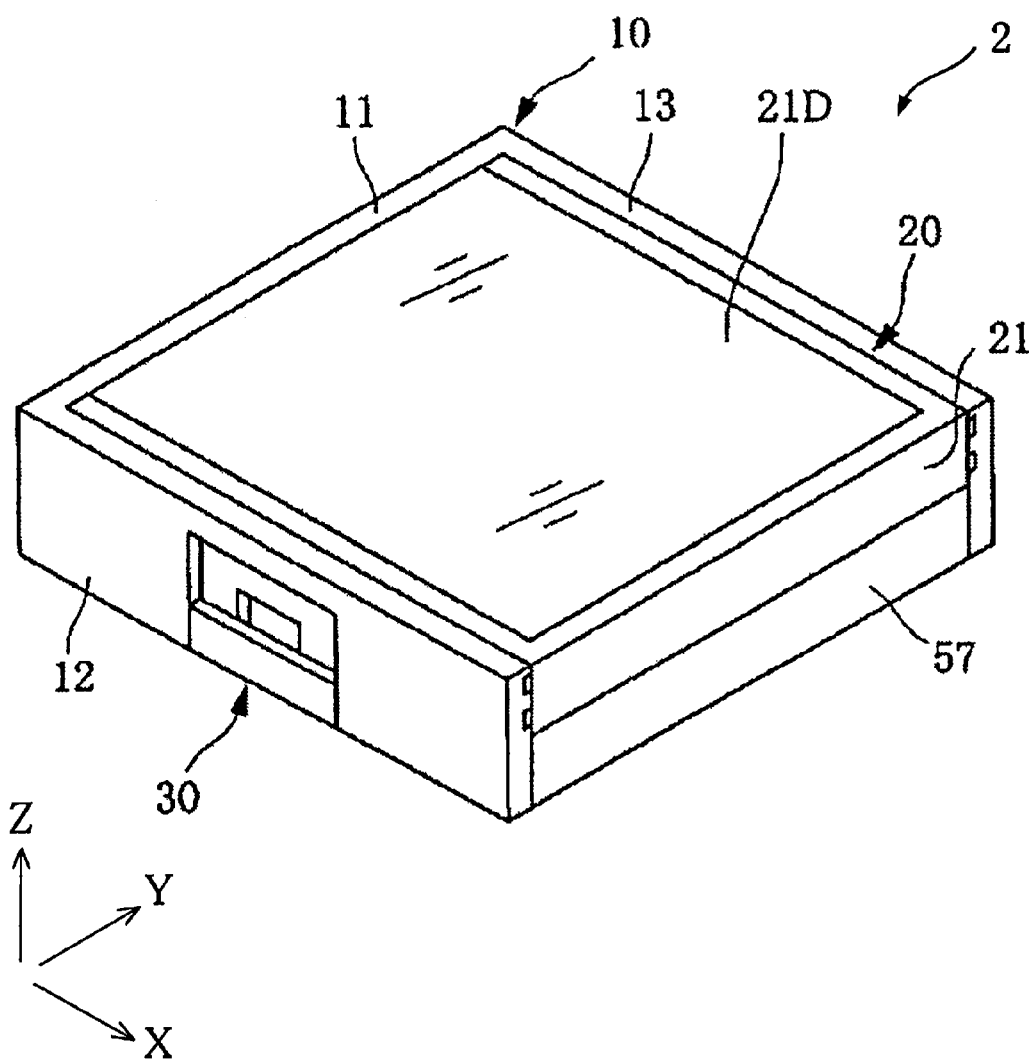
FIG. 1 is a perspective view showing the overall structure of a portable information processing device in an accommodated state.
Figure 2:
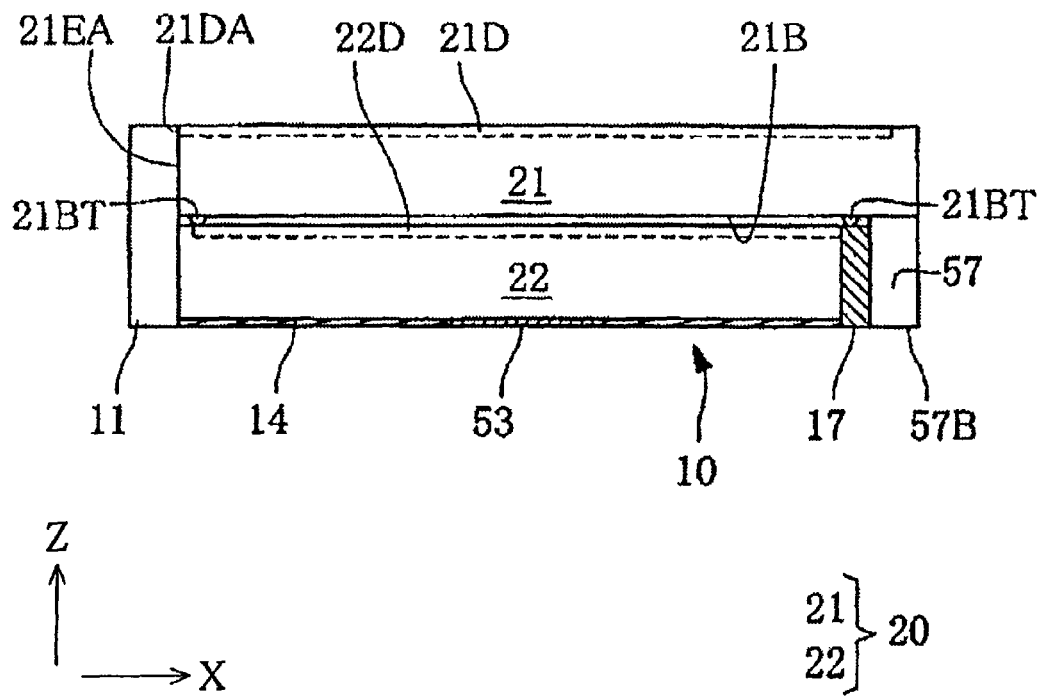
FIG. 2 is a cross-sectional view showing the overall structure of the portable information processing device in an accommodated state.

As shown in FIG. 1, a portable information processing device 2 includes: a casing 10; a display unit 20 accommodated in the casing 10; a movement mechanism 30 which makes the display unit 20 movable; and a control unit (described later) built in the casing 10. As shown in FIG. 2, the display unit 20 includes: a first display panel 21 having a first screen 21D; and a second display panel 22 having a second screen 22D.

Figure 3A:
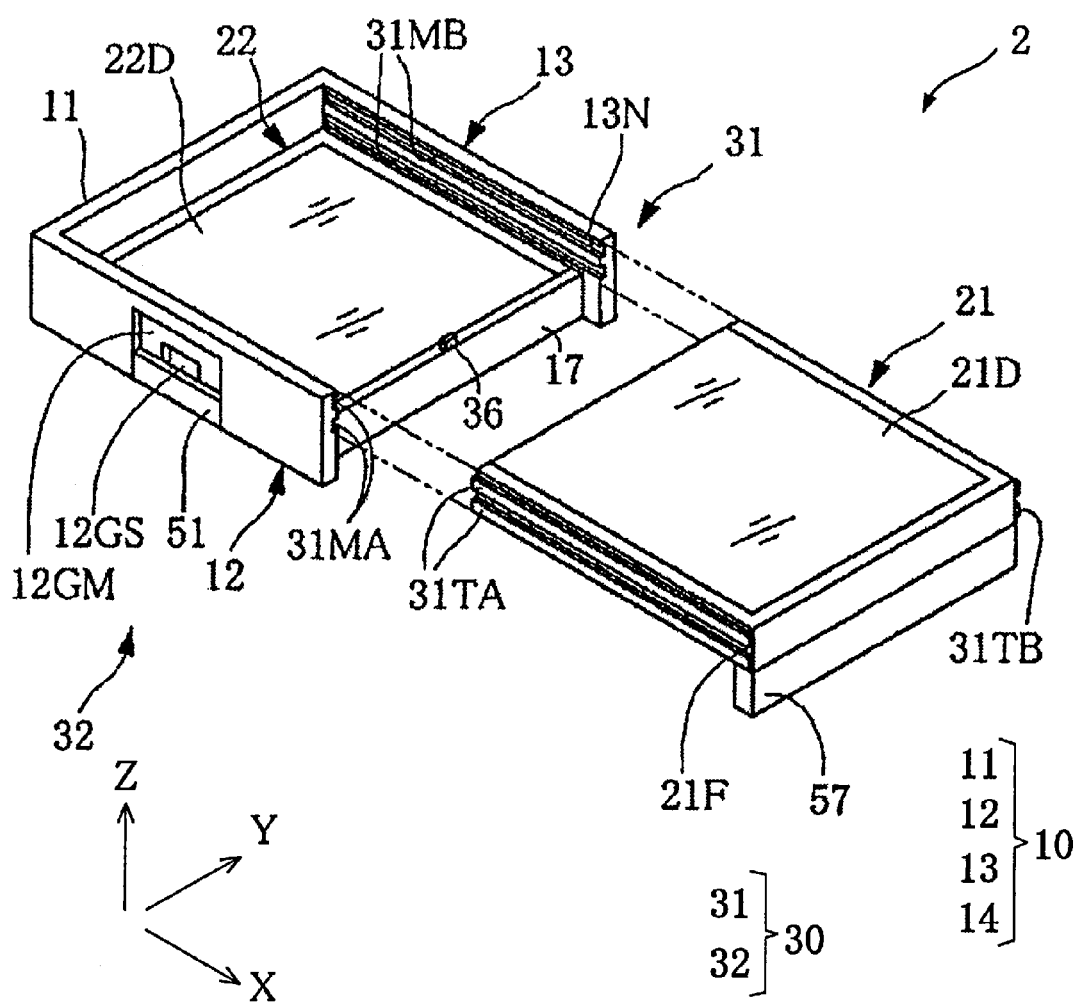
FIG. 3A is an exploded perspective view showing the overall structure of the portable information processing device.
Figure 4:
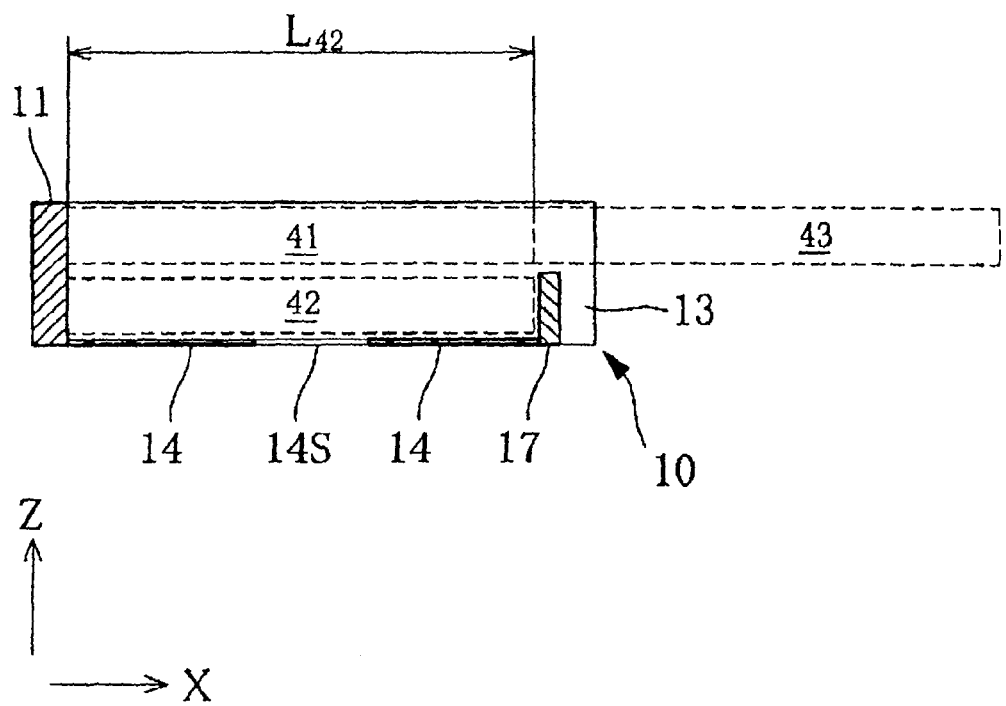
FIG. 4 is a cross-sectional view of a casing of the portable information processing device.

As shown in FIG. 3A and FIG. 4, the casing 10 includes: a rear plate portion 11 which extends in the lateral direction (Y direction); side plate portions 12, 13 which form a pair and extend parallel to each other in the frontward direction (X direction) from both end portions of the rear plate portion 11 in the Y direction respectively; a bottom plate portion 14; and a protective plate 17. The rear plate portion 11 and the side plate portions 12, 13 are joined to each other such that the rear plate portion 11 and the side plate portions 12, 13 form a U shape. In a portion surrounded by the rear plate portion 11 and the side plate portions 12, 13 which are joined to each other as described above, a first accommodating area 41 where the first display panel 21 is accommodated, and a second accommodating area 42 where the second display panel 21 is accommodated are formed such that the first accommodating area 41 and the second accommodating area 42 are arranged in order toward a lower side from an upper side. It is preferable that a length L42 from a rear end of the first accommodating area 41 to a rear end of the second accommodating area 42 is equal to a length L22 of the second display panel 22 in the longitudinal direction (see FIG. 5).

Returning to FIG. 3A, FIG. 4, a first neighboring area 43 is set such that the first neighboring area 43 is disposed adjacent to the first accommodating area 41 on an X direction side. A front portion of the first neighboring area 43 is set such that the front portion of the first neighboring area 43 projects to a position outside the casing 10. The first neighboring area 43 is disposed adjacent to a front side of the first accommodating area 41, and the first display panel 21 can pass through a boundary between the first neighboring area 43 and the first accommodating area 41. Further, a protective plate 17 is provided below the boundary between the first neighboring area 43 and the first accommodating area 41. The protective plate 17 extends in the Y direction from a front end portion of the side plate portion 12 to the front end portion of the side plate portion 12. The second accommodating area 42 is disposed adjacent to the first accommodating area 41, and the second display panel 22 can pass through a boundary between the first accommodating area 41 and the second accommodating area 42.

The first display panel 21 is accommodated in the first accommodating area 41 in a posture where the first screen 21D faces upward, and the second display panel 22 is accommodated in the second accommodating area 42 in a posture where the second screen 22D faces upward (see FIG. 2).

As shown in FIG. 3 and FIG. 6, the movement mechanism 30 includes a first slide mechanism 31 and a second slide mechanism 32. The first slide mechanism 31 includes inner grooves 31MA, 31MB formed on inner surfaces 12N, 13N of the pair of side plate portions 12, 13 respectively, and guide projections 31TA, 31TB formed on a pair of side surfaces 21F, 21G of the first display panel 21. The guide projections 31TA are fitted in the inner grooves 31MA, and the guide projections 31TB are fitted in the inner grooves 31MB.

The guide projections 31TA, 31TB are respectively formed of a projecting ridge which extends in the X direction. The number of guide projections 31TA and the number of guide projections 31TB may be two as shown in the drawing. However, the number of guide projection 31TA and the number of guide projection 31TB may be one or three or larger.

The inner grooves 31MA, 31MB extend in the X direction. Front ends of the inner grooves 31MA, 31MB open at front surfaces of the side plate portions 12, 13 respectively. By mounting the first display panel 21 in the casing 10 such that the guide projections 31TA, 31TB are fitted in the inner grooves 31MA, 31MB respectively, the first display panel 21 is made movable in the longitudinal direction. In this manner, the first display panel 21 is movable between an accommodated state where the first display panel 21 is positioned in the first accommodating area 41 (see FIG. 2) and a developed state where the first display panel 21 is positioned in the first neighboring area 43 (see FIG. 5).

Figure 5:
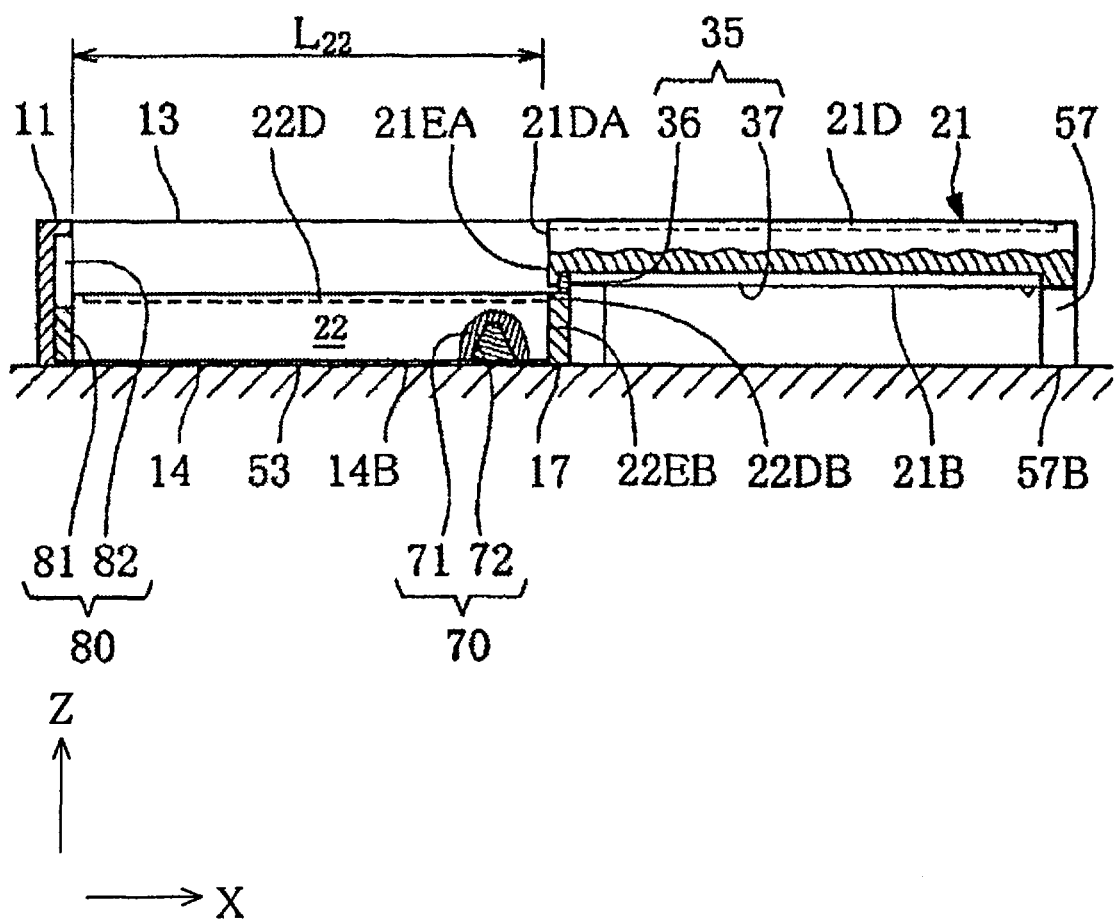
FIG. 5 is a cross-sectional view showing the overall structure of the portable information processing device when a first display panel is in a developed state and a second display panel is in an accommodated state.

Further, as shown in FIG. 3A and FIG. 5, the portable information processing device 2 includes a stopper mechanism 35. The stopper mechanism 35 includes: a stopper projecting portion 36 which extends in the upward direction from an upper surface of the protective plate 17; and a stopper groove 37 formed on a lower surface 21B of the first display panel 21. The stopper groove 37 extends in the X direction, and the stopper projecting portion 36 has a shape which can be fitted in the stopper groove 37. When the first display panel 21 is in a developed state, the stopper projecting portion 36 is engaged with a rear end of the stopper groove 37 (see FIG. 5). When the first display panel 21 is in an accommodated state (see FIG. 2), the stopper projecting portion 36 is engaged with a front end of the stopper groove 37.

Figure 7:
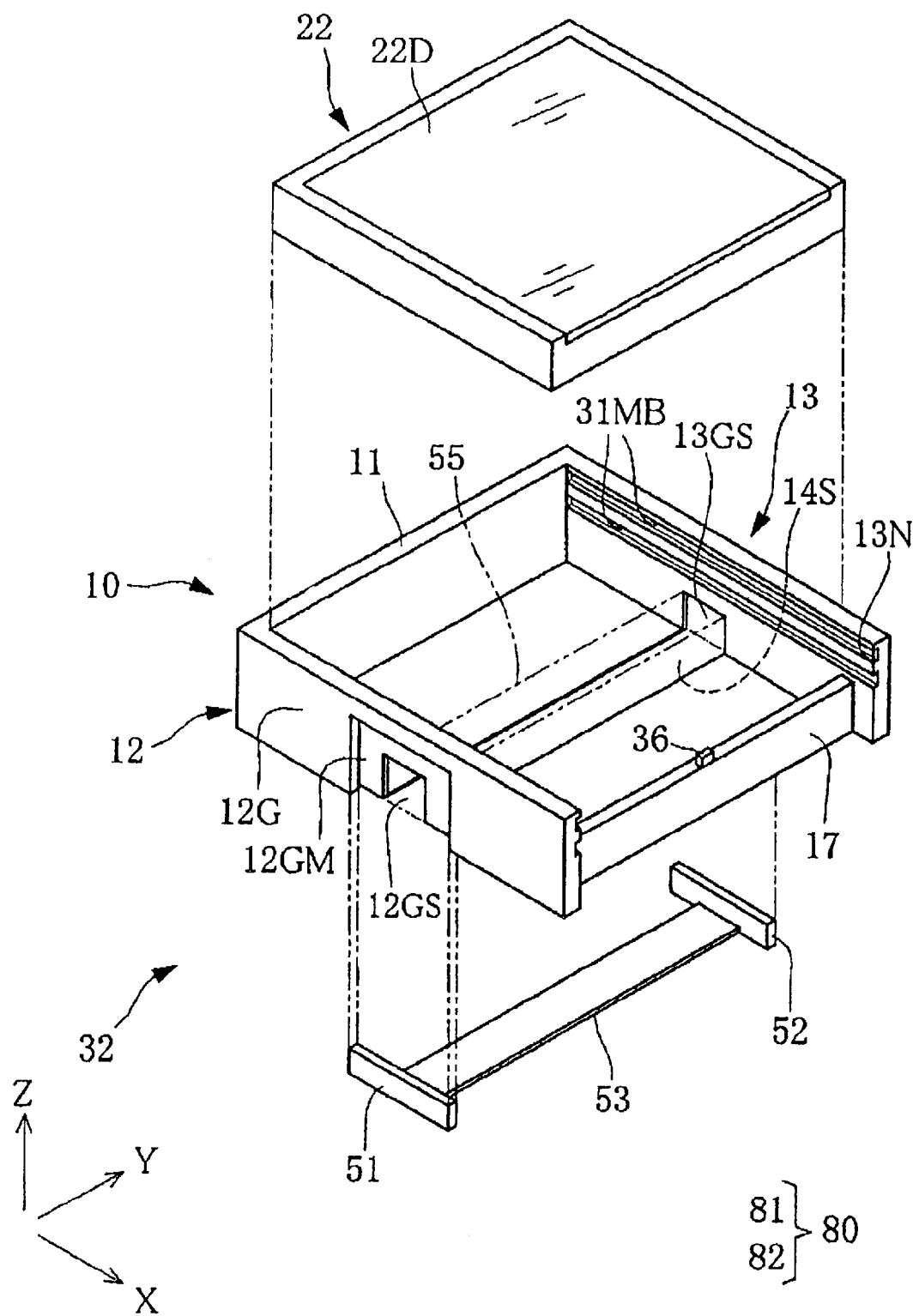
FIG. 7 is an exploded perspective view showing the overall structure of respective parts which constitute a second slide mechanism.

As shown in FIG. 6 and FIG. 7, the casing 10 has: an outer groove 12GM formed in an outer surface 12G of the side plate portion 12; a side surface slit 12GS formed in a bottom portion of the outer groove 12GM; an outer groove 13GM formed in an outer surface 13G of the side plate portion 13; a side surface slit 13GS formed in a bottom portion of the outer groove 13GM; and a bottom surface slit 14S formed in the bottom plate portion 14 of the casing 10 and extends in the Y direction. The side surface slit 12GS extends in the side plate portion 12 in the Z direction from a lower end of the side plate portion 12. An upper end of the side surface slit 12GS is positioned below the inner grooves 31MA. Accordingly, the side surface slit 12GS does not intersect with the inner grooves 31MA. In the same manner, the side surface slit 13GS extends in the side plate portion 13 in the Z direction from a lower end of the side plate portion 13. An upper end of the side surface slit 13GS is positioned below the inner grooves 31MB. Accordingly, the side surface slit 13GS does not intersect with the inner grooves 31MB.

Further, the portable information processing device 2 includes: an outer fitting plate 51 which is fitted in the outer groove 12GM; an outer fitting plate 52 which is fitted in the outer groove 13GM; and a connecting plate 53 which connects the outer fitting plates 51, 52 to each other. A width (a length in the X direction) of the connecting plate 53 is shorter than a width (a length in the X direction) of the bottom surface slit 14S. A space 55 which extends from the bottom plate portion 14 of the casing 10 in the Z direction is formed by the side surface slits 12GS, 13GS and the bottom surface slit 14S. Accordingly, the connecting plate 53 is made movable in the inside of the space 55. As a result, the outer fitting plates 51, 52 which are fitted in the pair of outer grooves 12GM and the like are made movable in the vertical direction integrally with the connecting plate 53. In this manner, the second slide mechanism 32 is constituted of the pair of outer grooves 12GM, 13GM; the side surface slits 12GS, 13GS; the pair of outer fitting plates 51, 52; and the connecting plate 53. The bottom surface slit 14S is formed so that a lower surface of the second display panel 22 is exposed to the outside through the bottom surface slit 14S. Due to such a constitution, the bottom surface slit 14S functions as a manipulation opening for pushing up the second display panel 22 from below.

Further, the second display panel 22 is connected to at least one of the outer fitting plates 51, 52 and the connecting plate 53. Accordingly, the second display panel 22 is made movable in the vertical direction by means of the second slide mechanism 32. In this manner, the second display panel 22 is made movable between an accommodated state where the second display panel 22 is positioned in the second accommodating area 42 (see FIG. 5) and a developed state where the second display panel 22 is positioned in the first accommodating area 41 (see FIG. 8). When the second display panel 22 is in a developed state, it is preferable that an upper end of the outer fitting plate 51 is engaged with an upper end of the outer groove 12GM. In such a case, the upper end of the outer groove 12GM and the upper end of the outer fitting plate 51 function as a stopper mechanism of the second slide mechanism 32.

When the second display panel 22 is in a developed state, an upper end of the outer fitting plate 52 may be engaged with an upper end of the outer groove 13GM, or an upper end of the connecting plate 53 may be engaged with an upper end of the side surface slit 13GS. In the former case, the upper end of the outer groove 13GM and the upper end of the outer fitting plate 52 function as a stopper mechanism of the second slide mechanism 32. On the other hand, in the latter case, the upper end of the side surface slit 13GS and the upper end of the connecting plate 53 function as a stopper mechanism of the second slide mechanism 32.

As shown in FIG. 5, the first screen 21D extends toward a front side (in the X direction) from a rear end surface 21EA of the first display panel 21 which is positioned on a rear side (in the direction opposite to the X direction). Accordingly, a rear end surface 21DA of the first screen 21D is exposed on the rear end surface 21EA of the first display panel 21. The second screen 22D extends toward a rear side of the second display panel 22 from a front end surface 22EB of the second display panel 22 which is disposed on a front side (X direction side). Accordingly, a front end surface 22DB of the second screen 22D is exposed on the front end surface 22EB of the second display panel 22.

The portable information processing device 2 includes a projecting portion 57. The projecting portion 57 is formed on the first display panel 21 such that the projecting portion 57 projects in the downward direction from a front end of the bottom surface 21B of the first display panel 21. The projecting portion 57 functions as a supporting member which supports the first display panel 21 in a developed state from below. It is preferable that the bottom surface 14B of the bottom plate portion 14 and a bottom surface 57B of the projecting portion 57 are made coplanar with each other.

Figure 9:
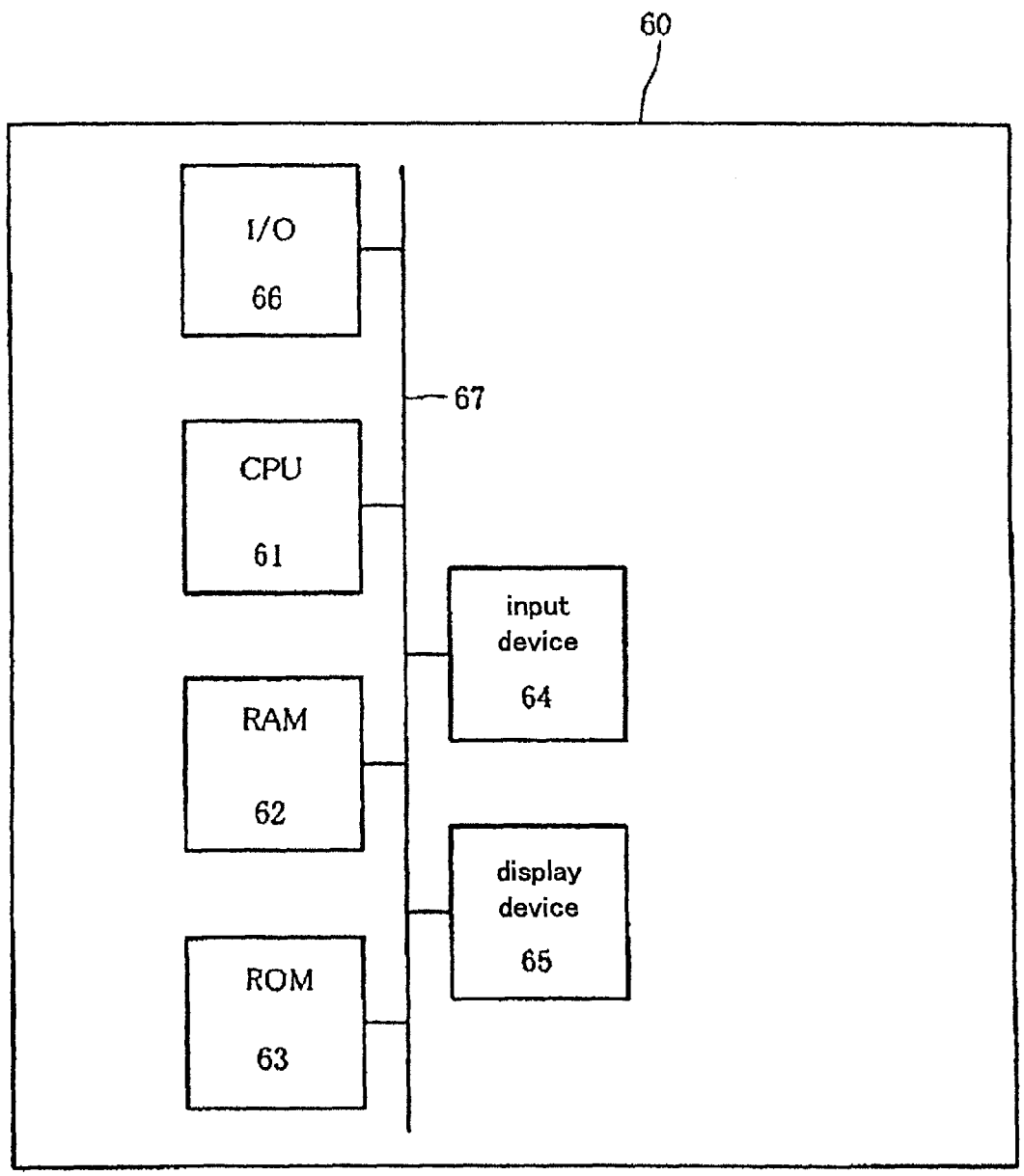
FIG. 9 is a function block diagram showing the overall structure of a control unit.

As shown in FIG. 9, a control unit 60 includes: a CPU 61; a RAM 62; a ROM 63; an input device 64; a display device 65; an input/output interface 66; and a bus 67. The CPU 61 is a so-called central processing unit, and realizes various kinds of functions of the portable information processing device 2 by executing various kinds of programs. The RAM 62 is a so-called RAM (random access memory) and is used as a working area of the CPU 61. The ROM 63 is a so-called ROM (read only memory), and stores a basic operating system and various kinds of programs executed by the CPU 61 therein. The input device 64 is a touch panel mounted on the first screen 21D or the second screen 22D, where various kinds of information is inputted. The input device 64 may be formed of a keyboard, a mouse or the like. The display device 65 is formed of the first display panel 21 and the second display panel 22, and various kinds of operation states are displayed on the first screen 21D or the second screen 22D. A power source is inputted through the input/output interface 66 from the outside, and control signals are inputted and outputted through the input/output interface 66. The bus 67 constitutes a wiring through which the CPU 61, the RAM 62, the ROM 63, the input device 64, the display device 65, the input/output interface 66 and the like are integrally connected to each other and communication is performed. When the basic operating system or various kinds of programs stored in the ROM 63 is/are executed by the CPU 61 in response to an input signal from the input device 64, an arithmetic operation result of the CPU 61 is outputted to the display device 65.

Next, a method of using the portable information processing device 2 is explained.

As shown in FIG. 2, the first display panel 21 in an accommodated state is disposed in the first accommodating area 41 (see FIG. 4) in a posture where the first screen 21D faces upward, and the second display panel 22 in an accommodated state is disposed in the second accommodating area 42 (see FIG. 4) in a posture where the first screen 21D faces upward. In such a state, the first display panel 21 is positioned in the first accommodating area 41 and hence, the second display panel 22 in an accommodated state cannot be transferred to a developed state.

Figure 10:
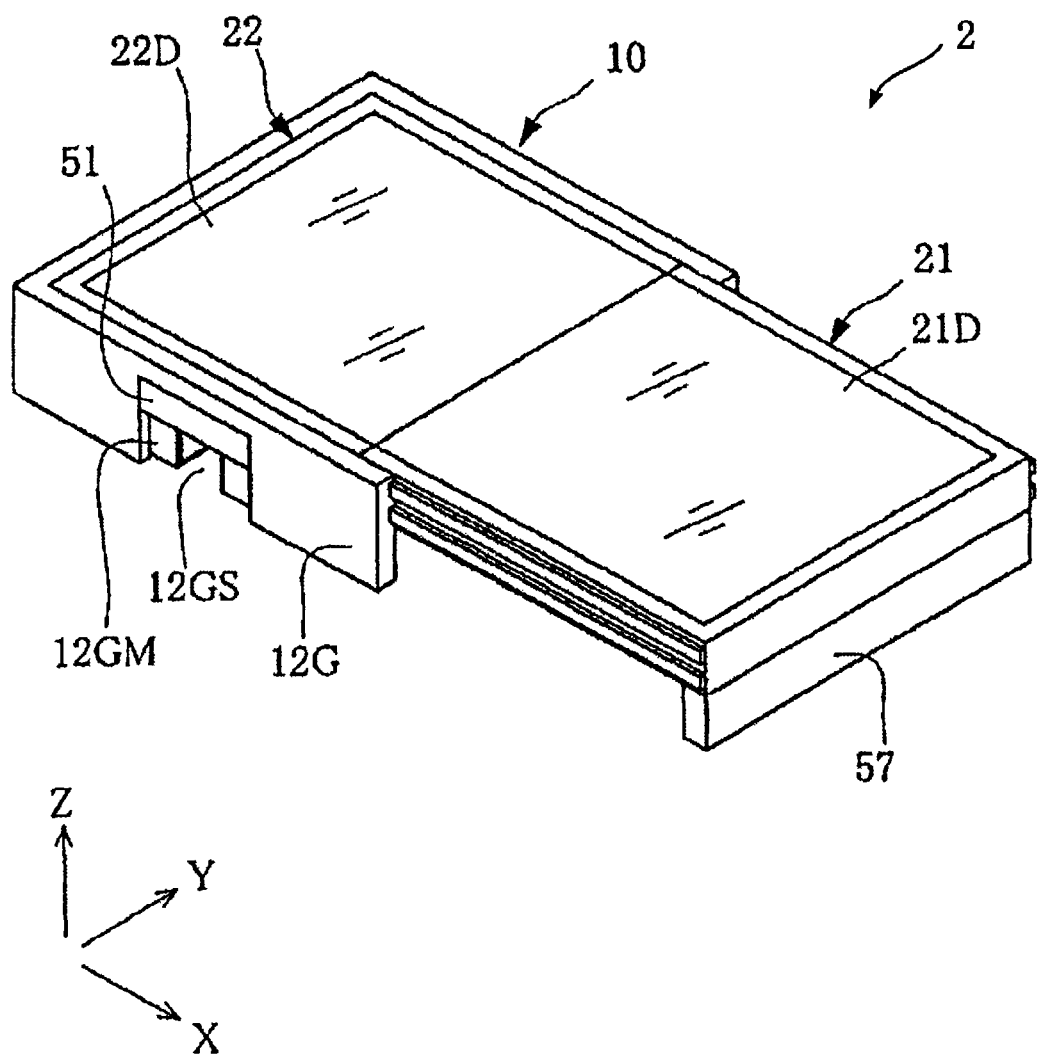
FIG. 10 is a perspective view showing the overall structure of the portable information processing device when the first display panel and the second display panel are in a developed state.

Next, by conducting an inclination manipulation or the like so as to incline the portable information processing device 2 such that a front side of the portable information processing device 2 is lowered and a rear side of the portable information processing device 2 is raised, the first display panel 21 is moved in the frontward direction until the stopper projecting portion 36 is brought into contact with the front end of the stopper groove 37 (see FIG. 5). As a result, the first display panel 21 is brought into a developed state where the first display panel 21 is positioned in the first neighboring area 43 and, at the same time, the first accommodating area 41 is brought into an empty state. Since the first accommodating area 41 is in an empty state, the second display panel 22 in an accommodated state is made transferable to a developed state. By applying a pushing manipulation or the like to the connecting plate 53 from below, the second display panel 22 is moved upward until the outer fitting plates 51, 52 are brought into contact with upper ends of the outer grooves 12GM, 13GM (see FIG. 6 and FIG. 7). As a result, the second display panel 22 is brought into a developed state where the second display panel 22 is positioned in the first accommodating area 41 (see FIG. 8 and FIG. 10).

When both the first display panel 21 and the second display panel 22 are brought into a developed state in this manner, the first screen 21D formed on the first display panel 21 and the second screen 22D formed on the second display panel 22 are arranged on the same plane or coplanar with each other. On the other hand, when the second display panel 22 in a developed state is moved in the downward direction by performing the push-down manipulation or the like, the second display panel 22 is brought into an accommodated state (see FIG. 5). By moving the first display panel 21 in a developed state in the rearward direction thereafter, the first display panel 21 is brought into an accommodated state (see FIG. 1 and FIG. 2).

In this manner, the portable information processing device 2 is configured such that, due to the movement of the first display panel 21 in the longitudinal direction and the movement of the second display panel 22 in the vertical direction, the first display panel 21 in an accommodated state and the second display panel 22 in an accommodated state can be brought into a developed state, or the first display panel 21 in a developed state and the second display panel 22 in a developed state can be brought into an accommodated state. Due to such a constitution, a large screen can be formed by integrating the first screen 21D and the second screen 22D and, at the same time, the manipulation of developing the first display panel 21 and the second display panel 22 can be performed within a small space.

Further, the portable information processing device 2 is configured such that the display unit 20 (the first display panel 21 and the second display panel 22) can be transferred between an accommodated state and a developed state merely by moving the first display panel 21 linearly in the longitudinal direction and moving the second display panel 22 linearly in the vertical direction. Accordingly, the manipulation of the first display panel 21 and the second display panel 22 becomes extremely simple and easy. In addition to such an advantageous effect, the moving manipulation of the display unit 20 becomes extremely simple and easy and hence, the portable information processing device 2 can be manufactured at a low cost. At the same time, a malfunction of the portable information processing device 2 attributed to the structure of the movement mechanism 30 or a malfunction of the portable information processing device 2 attributed to the sliding manipulation of the movement mechanism 30 minimally occurs.

Further, as shown in FIG. 5, the rear end surface 21DA of the first screen 21D is exposed on the rear end surface 21EA of the first display panel 21 and, at the same time, the front end surface 22DB of the second screen 22D is exposed on the front end surface 22EB of the second display panel 22. Accordingly, when the first display panel 21 and the second display panel 22 are brought into a developed state, the rear end surface 21DA of the first screen 21D and the front end surface 22DB of the second screen 22D are brought into contact with each other or approach each other. When the rear end surface 21DA of the first screen 21D approaches the front end surface 22DB of the second screen 22D, a distance from the rear end surface 21DA to the front end surface 22DB is 1 mm or less, for example. As a result, the first screen 21D and the second screen 22D are integrally formed with each other thus forming a seamless large screen (see FIG. 10).

Further, when the second display panel 22 is in an accommodated state, the front end surface 22DB of the second screen 22D is brought into contact with or approaches the protective plate 17 (see FIG. 5). Accordingly, when the second display panel 22 is in an accommodated state, the front end surface 22DB of the second screen 22D is protected by the protective plate 17. In the same manner, when the first display panel 21 is in an accommodated state, the rear end surface 21DA of the first screen 21D is brought into contact with or approaches the rear plate portion 11 of the casing 10 (see FIG. 2). Accordingly, when the first display panel 21 is in an accommodated state, the rear end surface 21DA of the first screen 21D is protected by the rear plate portion 11 of the casing 10. With the use of the rear plate portion 11 and the protective plate 17, it is possible to protect the end surfaces of the first screen 21D and the second screen 22D which can form a seamless large screen.

In addition to the above, as shown in FIG. 6 and FIG. 7, the inner grooves 31MA, 31MB which constitute rails of the first slide mechanism 31 are formed on the inner surfaces 12N, 13N of the side plate portions 12, 13 of the casing 10 respectively, and the outer grooves 12GM, 13GM which form a pair and constitute rails of the second slide mechanism 32 are formed on the outer surfaces 12G, 13G of the casing 10. Accordingly, compared with a case where the inner grooves 31MA, 31MB and the outer groove 12GM, 13GM are formed in either one of the inner surfaces 12N, 13N and either one of the outer surfaces 12G, 13G of the casing 10, the sliding movement of the first display panel 21 and the second display panel 22 becomes smooth.

Figure 8:
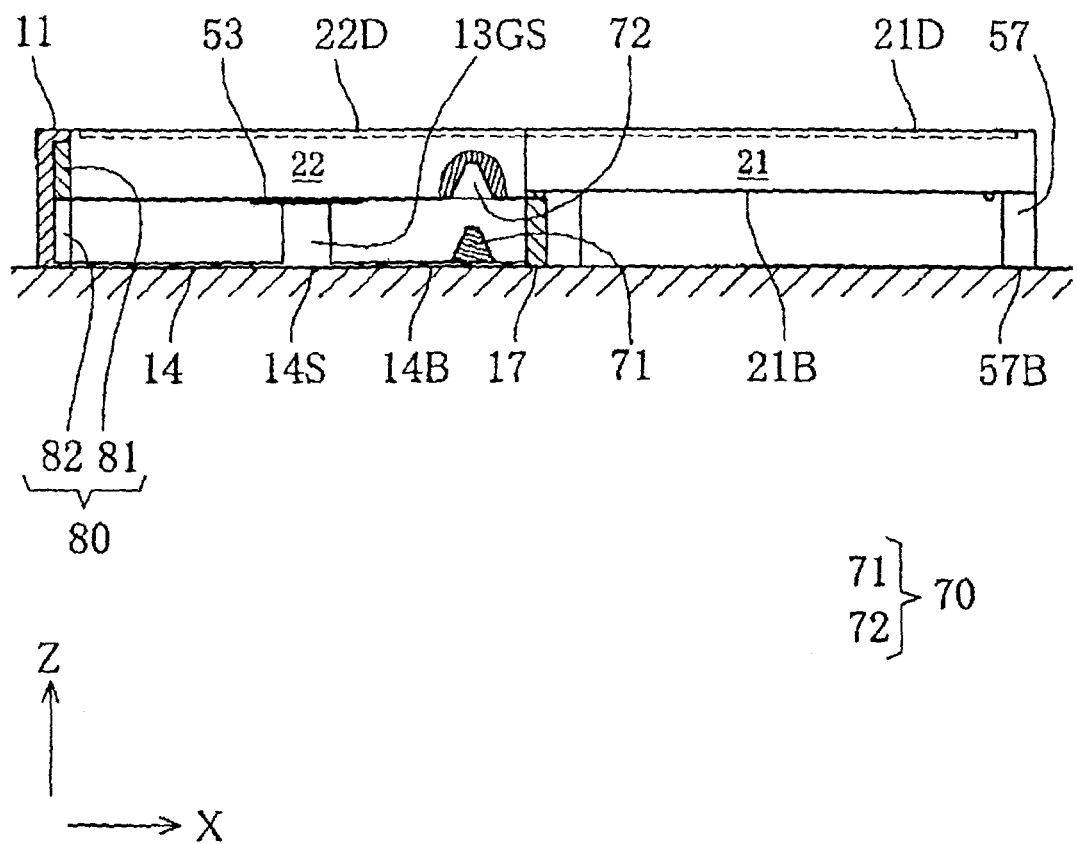
FIG. 8 is a cross-sectional view showing the overall structure of the portable information processing device when the first display panel and the second display panel are in a developed state.

Further, the first display panel 21 includes the projecting portion 57, and the bottom surface 14B of the bottom plate portion 14 and the bottom surface 57B of the projecting portion 57 are made coplanar with each other (see FIG. 8). Accordingly, when the first display panel 21 and the second display panel 22 are brought into a developed state, the portable information processing device 2 can be placed in a stable manner.

As shown in FIG. 5, it is preferable that the first display panel 21 has a bottom projection 21BT on the bottom surface 21B thereof. A height of the bottom projection 21BT is 1 to 2 mm, for example. The bottom projection 21BT is arranged at a position where, when the first display panel 21 and the second display panel 22 are in an accommodated state, the bottom projection 21BT avoids the second screen 22D, that is, the bottom projection 21BT is brought into contact with a periphery of the second screen 22D on an upper surface of the second display panel 22. Due to such a constitution, when the first display panel 21 is moved between the first accommodating area 41 and the first neighboring area 43, it is possible to avoid the generation of rubbing between the bottom surface 21B of the first display panel 21 and the second screen 22D of the second display panel 22. Here, in place of the bottom projection 21BT arranged on the bottom surface 21B, a projection may be formed on a peripheral portion of the upper surface of the second display panel 21 (a portion except for the second screen 22D). The projection is brought into contact with the lower surface of the first display panel 21 and hence, it is possible to avoid rubbing between the bottom surface 21B of the first display panel 21 and the second screen 22D of the second display panel 22 when the first display panel 21 is moved between the first accommodating area 41 and the first neighboring area 43.

Figure 11:
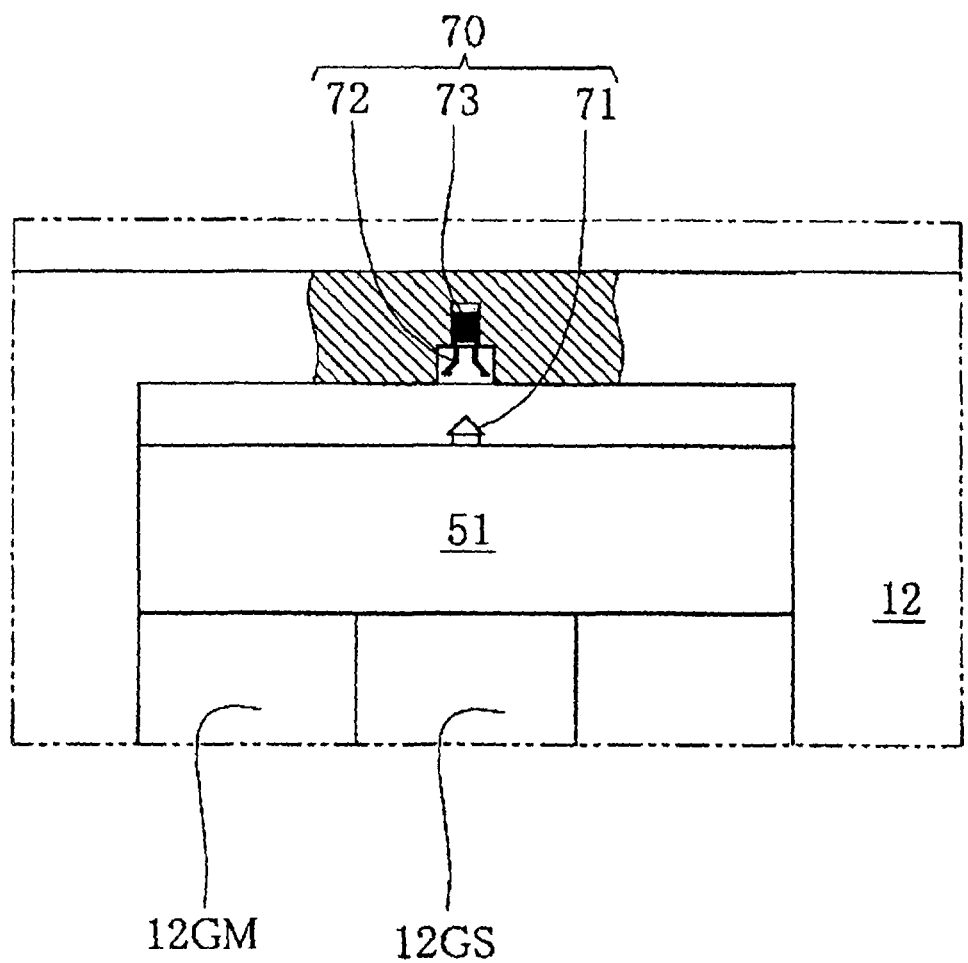
FIG. 11 is a side view showing the overall structure of a push lock mechanism.

Further, as shown in FIG. 11, the portable information processing device 2 may include a developed state maintaining unit by which a developed state of the second display panel 22 is maintained. A developed state maintaining unit is formed of so-called push lock mechanisms 70. Each push lock mechanism 70 includes: a locking projection 71 which is formed on an upper end surface of the outer fitting plate 51, 52 (the outer fitting plate 52 being not shown in the drawing) in an upwardly projecting manner; a projection receiving portion 72 which is formed on an upper end of the outer groove 12GM, 13GM (the outer groove 13GM being not shown in the drawing), and has an insertion port for allowing the insertion of the locking projection 71 which is opened in the downward direction; and a spring 73 which biases the projection receiving portion 72 in the downward direction. When the second display panel 22 is pushed up such that the locking projection 71 is inserted into the projection receiving portion 72, the locking projection 71 is engaged with the projection receiving portion 72 and hence, a developed state of the second display panel 22 is maintained. Further, by pushing up the second display panel 22 in a developed state from below, the engagement of the locking projection 71 by the projection receiving portion 72 is released and, at the same time, the second display panel 22 is returned to an accommodated state due to the gravity.

In place of mounting the protective plate 17 on the casing 10, the protective plate 17 may be integrally formed with the projecting portion 57.

Figure 3B:
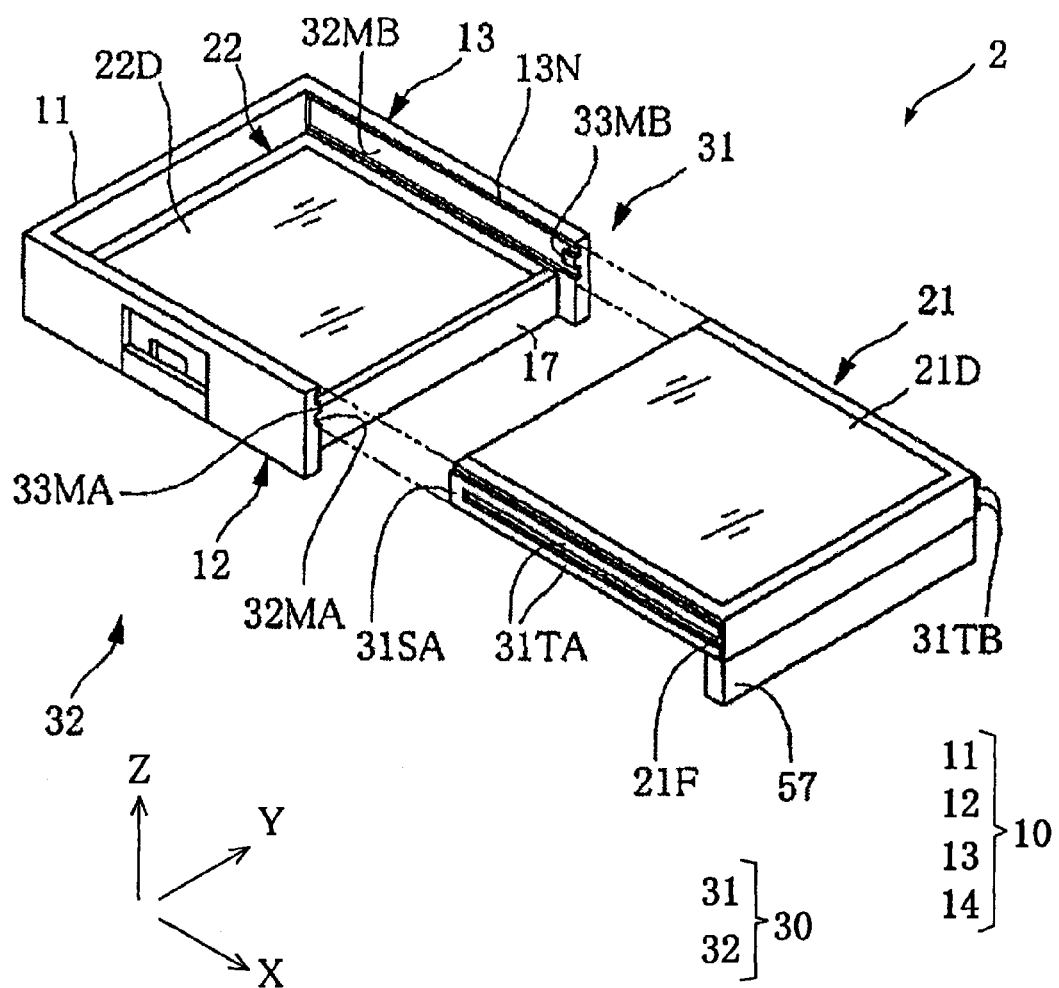
FIG. 3B is an exploded perspective view showing the overall structure of the portable information processing device.

In place of two inner grooves 31MA shown in FIG. 3A, a wide inner groove 32MA shown in FIG. 3B may be formed. The wide inner groove 32MA which extends in the X direction can be fitted on two guide projections 31TA. An upper edge of the wide inner groove 32MA is engaged with an upper edge of the upper guide projection 31TA, and a lower edge of the wide inner groove 31SA is engaged with a lower edge of the lower guide projection 31TA. By means of two guide projections 31TA and the wide inner groove 32MA, the first display panel 21 is made slidable in the longitudinal direction. Further, a rear projection 31SA which connects rear end portions of two guide projections 31TA to each other may be formed on the side surface 21F of the first display panel 21, and a stopper projection 33MA may be formed on a front end of the wide inner groove 32MA. When the first display panel 21 is in a developed state, the rear projection 31SA is engaged with the stopper projection 33MA. In this manner, the stopper mechanism which stops the sliding movement of the first display panel 21 is formed by the rear projection 31SA and the stopper projection 33MA. In the same manner, in place of two inner grooves 31MB shown in FIG. 3A, a wide inner groove 32MB which can be fitted on two guide projections 31TB shown in FIG. 3B may be formed. A rear projection (not shown in the drawing) which connects rear end portions of two guide projections 31TB to each other may be formed on the side surface 21G of the first display panel 21 (see FIG. 6), and a stopper projection 33MB may be formed on a front end of the wide inner groove 32MB.

In the above-mentioned embodiment, the rear end surface 21DA of the first screen 21D is protected using the rear plate portion 11. However, the present invention is not limited to the above case, and the rear end surface 21DA of the first screen 21D may be protected using a protective member which projects in the upward direction from a rear end of the upper surface of the second display panel 22.

Further, as shown in FIG. 5 and FIG. 8, the portable information processing device 2 may include a positioning mechanism 70 which performs the positioning of the second display panel 22. The positioning mechanism 70 includes: positioning projections 71 projecting in the upward direction from an upper surface of the bottom plate portion 14; and positioning recessed portions 72 formed on a lower surface of the second display panel 22. The number of positioning projections 71 formed on the upper surface of the bottom plate portion 14 may be one or two or more. The positioning projection 71 has a shape which allows the fitting of the positioning projection 71 into the positioning recessed portion 72 (truncated cone shape, for example). Further, the positions where the positioning projections 71 are formed and the positions where the positioning recessed portions 72 are formed are set at positions where the positioning projections 71 are fitted into the positioning recessed portions 72 when the second display panel 22 is in an accommodated state. A height of the positioning projection 71 is smaller than a distance the second display panel 22 is moved in the Z direction. It is preferable that the positioning projection 71 has a tapered shape. By forming the positioning projection 71 into a tapered shape, the second display panel 22 can be smoothly moved to an accommodated state (see FIG. 5) from a developed state (see FIG. 8).

As the slide mechanism which makes the second display panel 22 movable in the vertical direction, a slide mechanism 80 shown in FIG. 5 and FIG. 8 may be used. The slide mechanism 80 includes: a slide projection 81 formed on a rear side surface of the second display panel 22; and a slide groove 82 formed on a rear inner surface of the casing 10, that is, on the inner surface of the rear plate portion 11. The slide projection and the slide groove 82 extend in the Z direction respectively, and have shapes which allow the fitting between the slide projection 81 and the slide groove 82. When the second display panel 22 is in a developed state, an upper edge of the slide projection 81 is engaged with an upper edge of the slide groove 82. Although the position in the Y direction where the slide groove 82 is formed is not particularly limited, it is preferable that the slide groove 82 is formed at both end portions of the rear plate portion 11 in the Y direction.

In the above-mentioned embodiment, the first display panel 21 is moved in the longitudinal direction, and the second display panel 22 is moved in the vertical direction. However, the present invention is not limited to the above case. The second display panel 21 may be moved in the longitudinal direction, and the first display panel 22 may be moved in the vertical direction respectively.

In the above-mentioned embodiment, the inner grooves 31MA, 31MB formed on the inner surfaces 12N, 13N of the side plate portions 12, 13 are used as the constitutional elements of the first slide mechanism 31, and the outer grooves 12GM, 13GM formed on the outer surfaces 12G, 13G are used as the constitutional elements of the second slide mechanism 32. However, the present invention is not limited to the above case. For example, the outer groove 12GM may extend on the outer surfaces 12G, 13G in the X direction instead of extending in the Z direction, and the inner grooves 31MA, 31MB may extend on the inner surfaces 12N, 13N in the Z direction instead of extending in the X direction.

In the above-mentioned embodiment, the plate-shaped first display panel 21 is used as the first display part. However, the present invention is not limited to the above case. A first display member having another shape may be used as the first display part. In the same manner, although the plate-shaped second display panel 22 is used as the second display part, the present invention is not limited to the above case. A second display member having another shape may be used as the second display part.

In the above-mentioned embodiment, the first slide mechanism 31 which is constituted of the inner grooves 31MA, 31MB and the guide projections 31TA, 31TB formed on the side surfaces 21F, 21G is used. However, the present invention is not limited to the above case. A one-end-portion-fitting groove in which one end portion of the first display panel 21 in the Y direction can be fitted may be formed on the side plate portion 12, and a the-other-end-portion fitting groove in which the other end portion of the first display panel 21 in the Y direction can be fitted may be formed on the side plate portion 13. In such a case, the first slide mechanism is constituted of one end portion of the first display panel 21 in the Y direction, the one-end-portion fitting groove, the other end portion of the first display panel 21 in the Y direction, and the the-other-end-portion fitting groove.

Next, a second embodiment is explained.

Hereinafter, parts which make this embodiment different from the above-mentioned embodiment are explained. Parts which are equal to the corresponding parts of the above-mentioned embodiment are given the same symbols, and the detailed explanation of such parts is omitted.

Figure 12:
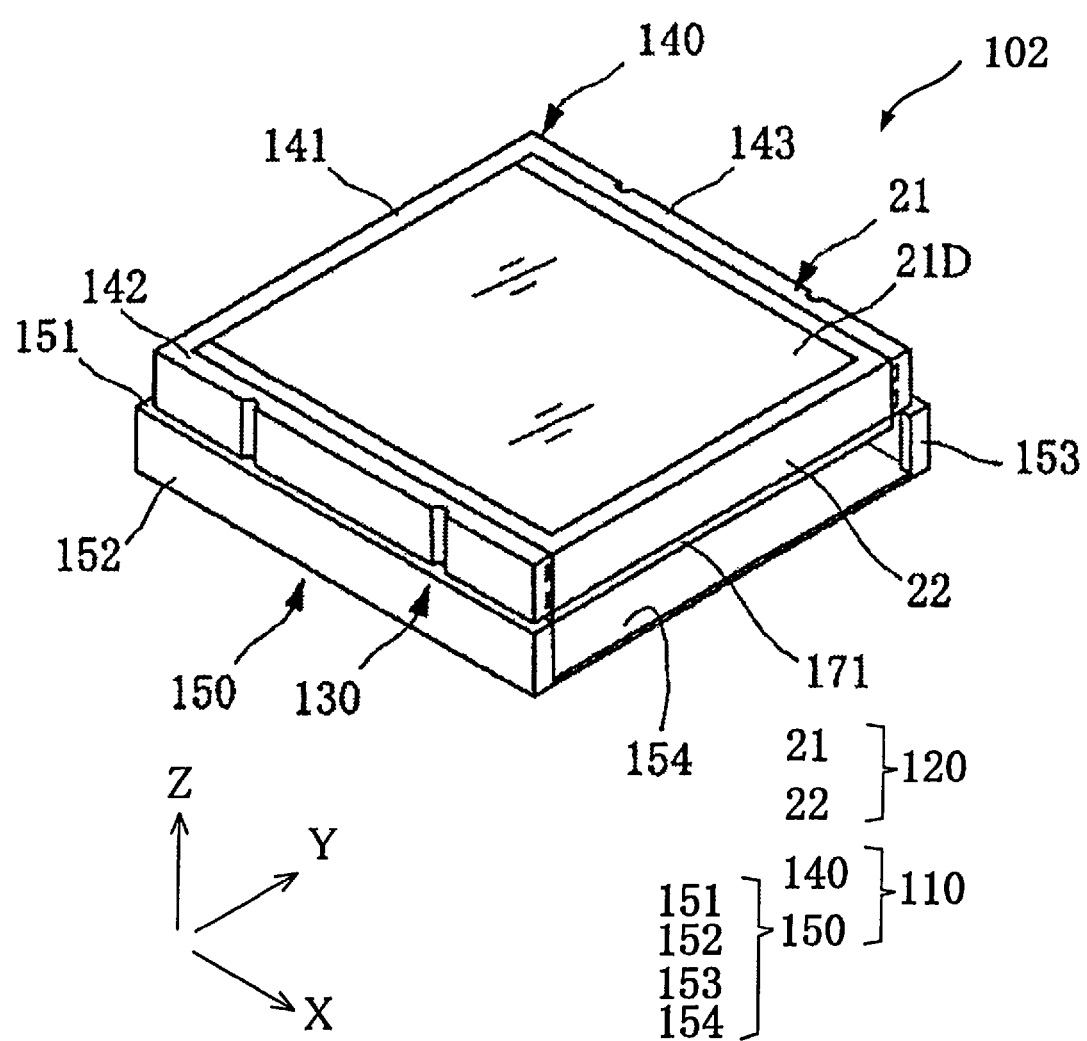
FIG. 12 is a perspective view showing the overall structure of the portable information processing device in an accommodated state.
Figure 13:
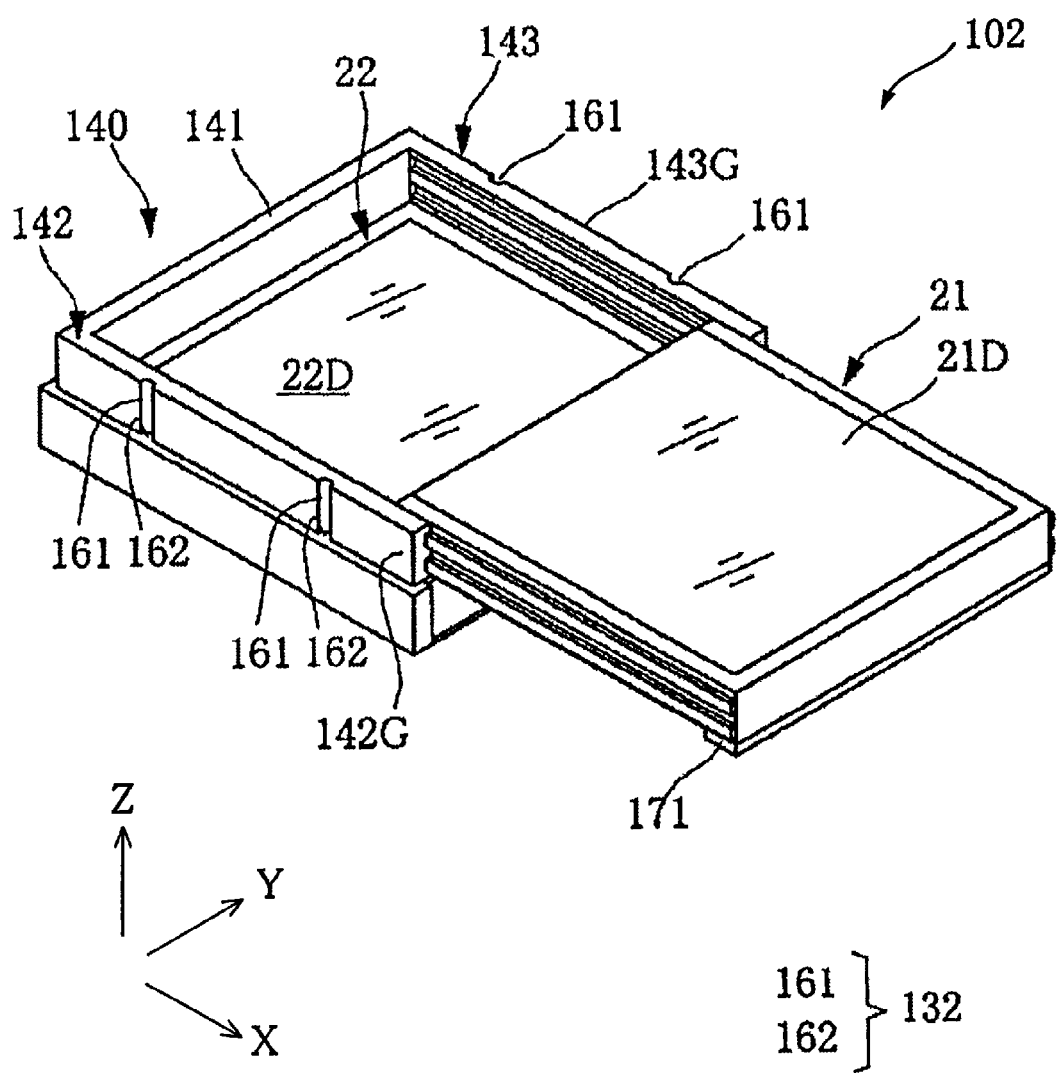
FIG. 13 is a perspective view showing the overall structure of the portable information processing device when the first display panel is in a developed state.

As shown in FIG. 12 and FIG. 13, a portable information processing device 102 includes: a casing 110: a display unit 120 accommodated in the casing 110; a movement mechanism 130 which makes the display unit 120 movable; and a control unit 60 (see FIG. 9) built in the casing 110. The display unit 120 includes a first display panel 21 having a first screen 21D, and a second display panel 22 having a second screen 22D.

The casing 110 includes an inner casing 140 and an outer casing 150. The inner casing 140 includes a rear plate portion 141 which extends in the Y direction, and side plate portions 142, 143 which form a pair and extend parallel to each other in the frontward direction from both ends of the rear plate portion 141 in the Y direction respectively. The rear plate portion 141 and the pair of side plate portions 142, 143 are joined to each other such that the rear plate portion 141 and the side plate portions 142, 143 form a U shape. In a portion surrounded by the rear plate portion 141 and the pair of side plate portions 142, 143, a first accommodating area 141 (see FIG. 14) in which the first display panel 21 is accommodated is formed.

Figure 15:
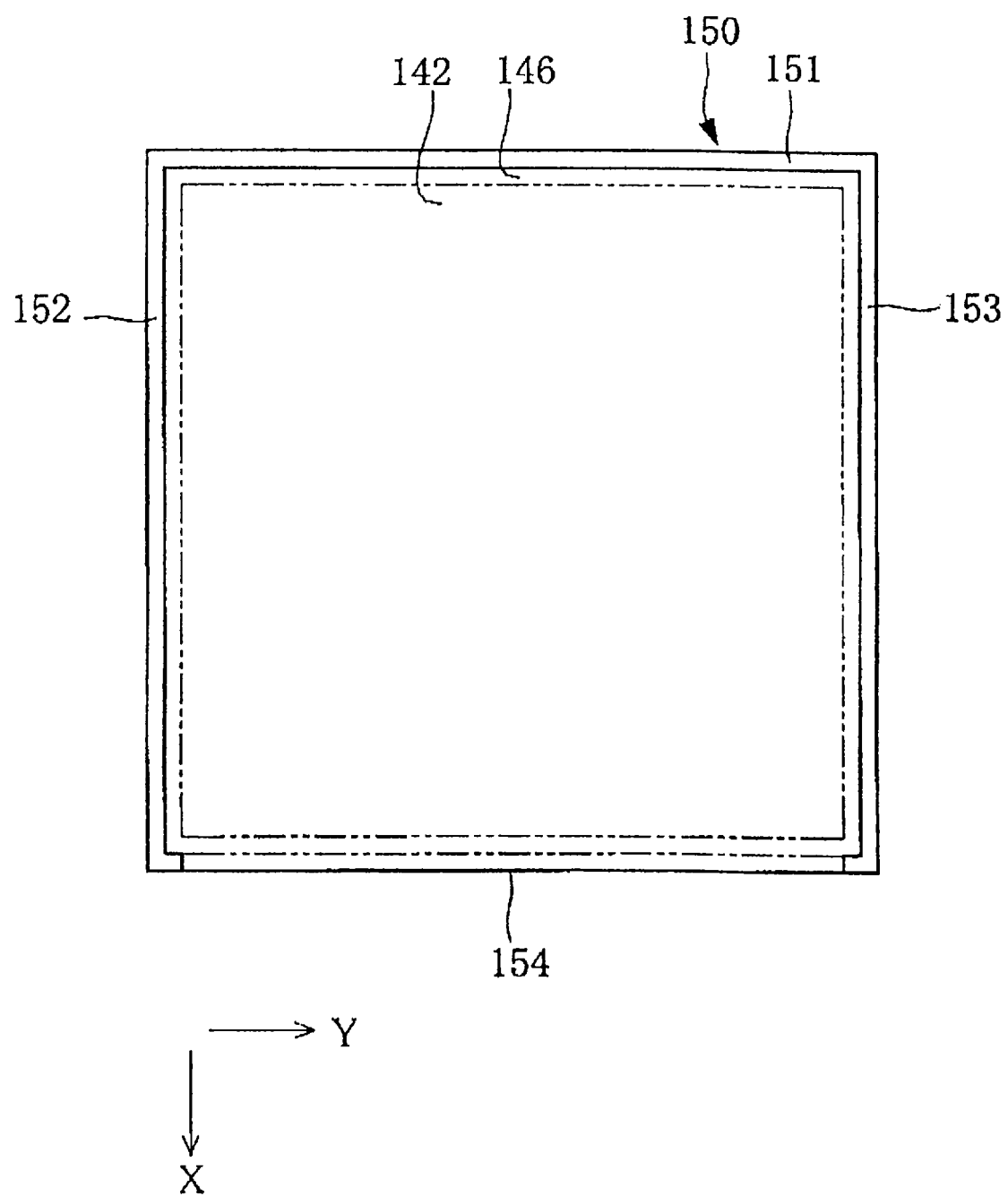
FIG. 15 is a plan view showing the overall structure of an outer casing.

On the other hand, as shown in FIG. 15, the outer casing 150 includes: a rear plate portion 151 which extends in the Y direction; side plate portions 152, 153 which form a pair and extend parallel to each other in the frontward direction from both ends of the rear plate portion 151 in the Y direction respectively; and a bottom portion 154. By joining the rear plate portion 151, the pair of side plate portions 152, 153 and the bottom portion 154 to each other, the outer casing 150 is formed into a U shape. In a portion surrounded by the rear plate portion 151, the pair of side plate portions 152, 153 and the bottom portion 154, a second accommodating area 142 in which the second display panel 22 is accommodated and an inner casing accommodating area 146 which is disposed around the second accommodating area 142 and in which the inner casing 140 is accommodated are disposed.

Figure 14:
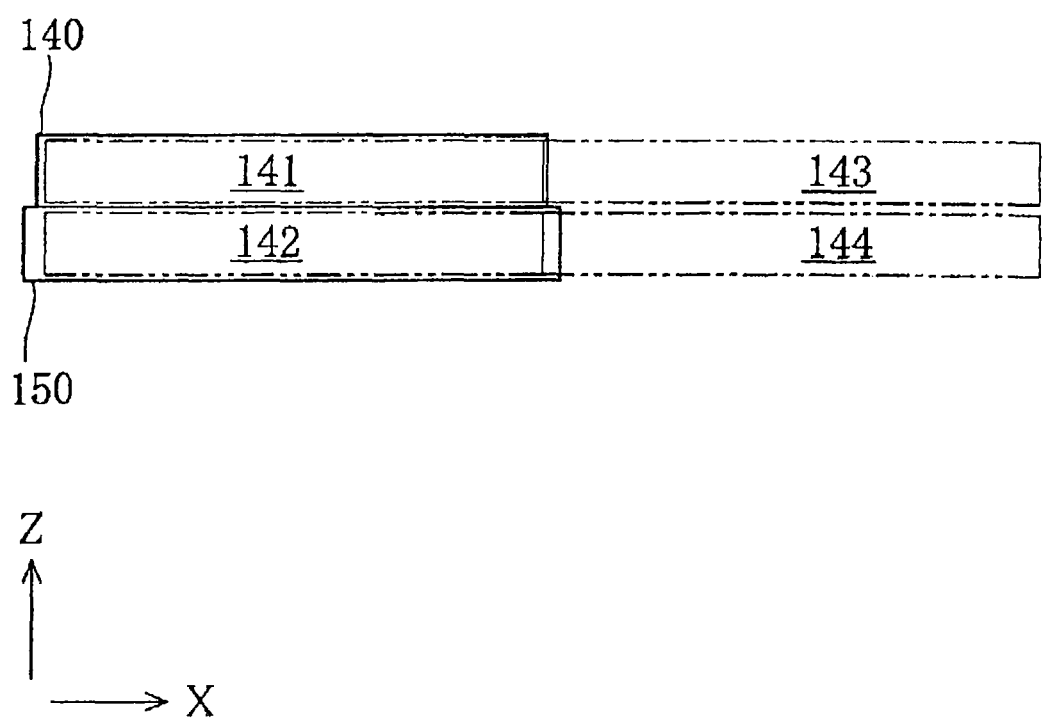
FIG. 14 is a side view showing the overall structure of the portable information processing device.

Further, as shown in FIG. 14, a first neighboring area 143 which is disposed adjacent to the first accommodating area 141 is set on a front side of the first accommodating area 141, and a second neighboring area 144 which is disposed adjacent to the second accommodating area 142 is set on a front side of the second accommodating area 142. The first display panel 21 can pass through a boundary between the first accommodating area 141 and the first neighboring area 143 and a boundary between the first neighboring area 143 and the second neighboring area 144.

The movement mechanism 130 includes: a first display panel rail unit 131 which makes the first display panel 21 movable in the longitudinal direction; and a rail movement mechanism 132 which makes the first display panel rail unit 131 movable in the vertical direction.

Figure 16:
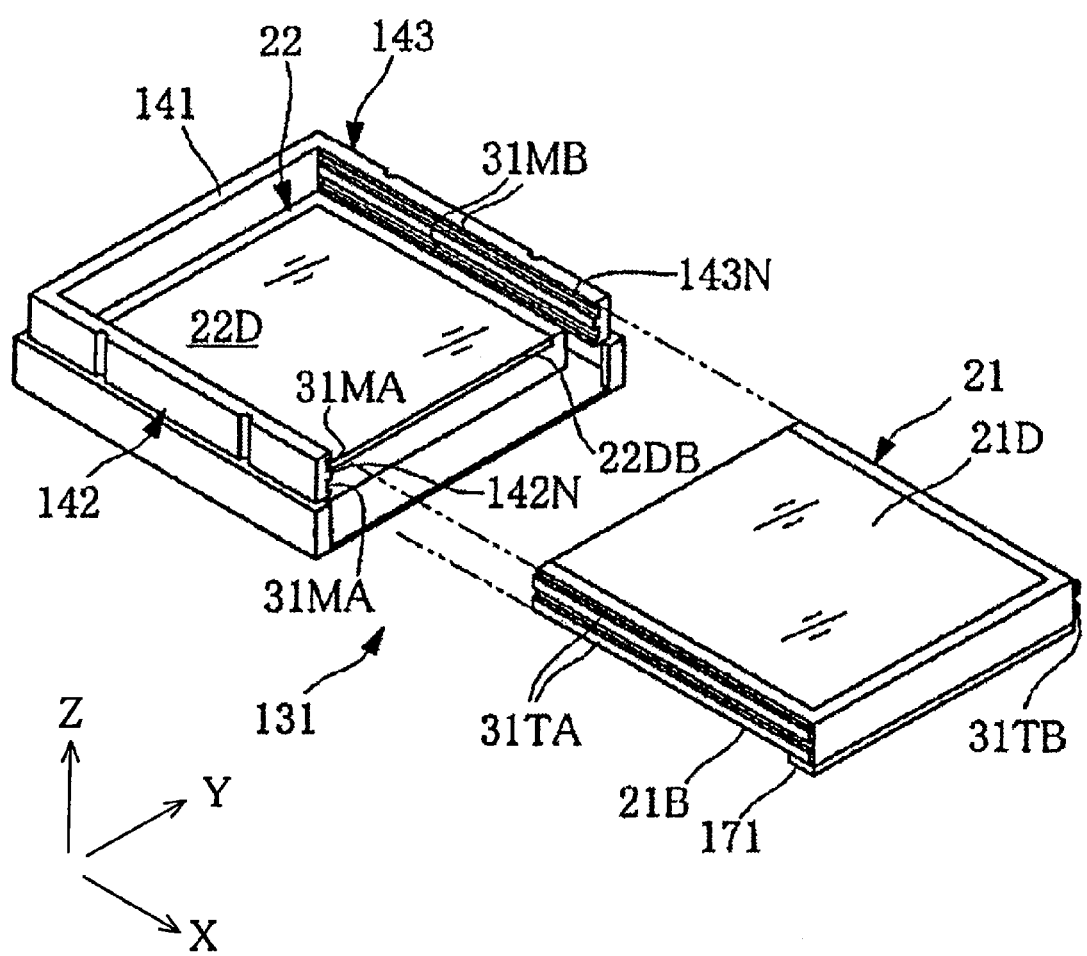
FIG. 16 is an exploded perspective view showing the overall structure of the portable information processing device.

As shown in FIG. 16, the first display panel rail unit 131 includes: inner grooves 31MA, 31MB formed on inner surfaces 142N, 143N of the pair of side plate portions 142, 143; and guide projections 31TA, 31TB which are formed on a pair of side surfaces of the first display panel 21, and are fitted in the inner grooves 31MA, 31MB. Although the illustration of the inner grooves 13MA and the illustration of the guide projections 31TB are omitted in FIG. 16, the inner grooves 13MA and the guide projections 31TB are equal to the corresponding members shown in FIG. 6.

The inner grooves 31MA, 31MB extend in the X direction. By mounting the first display panel 21 on the inner casing 140 such that the guide projections 31TA, 31TB are fitted in the inner grooves 31MA, 31MB respectively, the first display panel 21 are made movable in the longitudinal direction. In this manner, the first display panel 21 is made movable between an accommodated state (see FIG. 12) where the first display panel 21 is positioned in the first accommodating area 141 (see FIG. 14) and a developed state (see FIG. 13) where the first display panel 21 is positioned in the first neighboring area 143 (see FIG. 14).

As shown in FIG. 13 and FIG. 14, grooves 161 which extend in the Z direction are formed on outer surfaces 142G, 143G of the side plate portions 142, 143 of the inner casing 140. Projecting ridges 162 which extend in the Z direction are formed on inner surfaces of the side plate portions 152, 153 of the outer casing 159. Each projecting ridge 162 has a shape which allows fitting between the projecting ridge 162 and the groove 161. When the inner casing 140 is connected with the outer casing 150 such that the projecting ridges 162 are fitted in the grooves 161, the inner casing 140 and the outer casing 150 are relatively moved so as to approach each other or to be away from each other in the Z direction. In this manner, the projecting ridges 162 and the grooves 161 constitute the rail movement mechanism 132. Due to such a constitution, the first display panel 21 can be transferred between an accommodated state (see FIG. 17) where the first display panel 21 is positioned in an inner casing accommodating area 146 (see FIG. 15) and is accommodated in the outer casing 150 and a raised state (see FIG. 12) where the first display panel 21 is positioned directly above the inner casing accommodating area 146 (see FIG. 15). Further, when the first display panel 21 is in a raised state, lower ends of grooves 161 are engaged with lower ends of the projecting ridges 162. Accordingly, the lower ends of the grooves 161 function as a stopper mechanism for stopping the vertical movement of the first display panel 21.

Next, the method of using the portable information processing device 102 is explained.

In the portable information processing device 102 where the inner casing 140 is in an raised state and, at the same time, the first display panel 21 is in an accommodated state as shown in FIG. 12, the first display panel 21 in an accommodated state is disposed in the first accommodating area 141 in a posture where the first screen 21D faces upward, and the second display panel 22 in an accommodated state is disposed in the second accommodating area 142 in a posture where the first screen 21D faces upward. At this stage, the first display panel 21 is positioned in the first accommodating area 141 and hence, even when the push-down manipulation or the like of the first display panel 21 or the inner casing 130 is performed, the inner casing 140 cannot be transferred to an accommodated state (see FIG. 17).

Next, by conducting an inclination manipulation or the like so as to incline the portable information processing device 102 such that a front side of the portable information processing device 102 is lowered and a rear side of the portable information processing device 102 is raised, the first display panel 21 is moved in the frontward direction (X direction) until the guide projections 31TA, 31TB are brought into contact with front ends of the inner grooves 31MA, 31MB (see FIG. 16). As a result, the first display panel 21 is brought into a developed state, and the first accommodating area 141 is brought into an empty state (see FIG. 13).

The first accommodating area 141 is brought into an empty state and hence, the inner casing 140 can be transferred to an accommodated state (see FIG. 17) by performing the push-down manipulation or the like of the first display panel 21 or the inner casing 130. When the inner casing 140 is brought into an accommodated state, the first accommodating area 141 in an empty state overlaps with the second accommodating area 42 and, at the same time, the first neighboring area 143 overlaps with the second neighboring area 144. Accordingly, the first display panel 21 positioned in the first neighboring area 143 is positioned in the second neighboring area 144. As a result, the second display panel 22 positioned in the second accommodating area 42 and the first display panel 21 positioned in the second neighboring area 144 are arranged along with each other.

Figure 17:
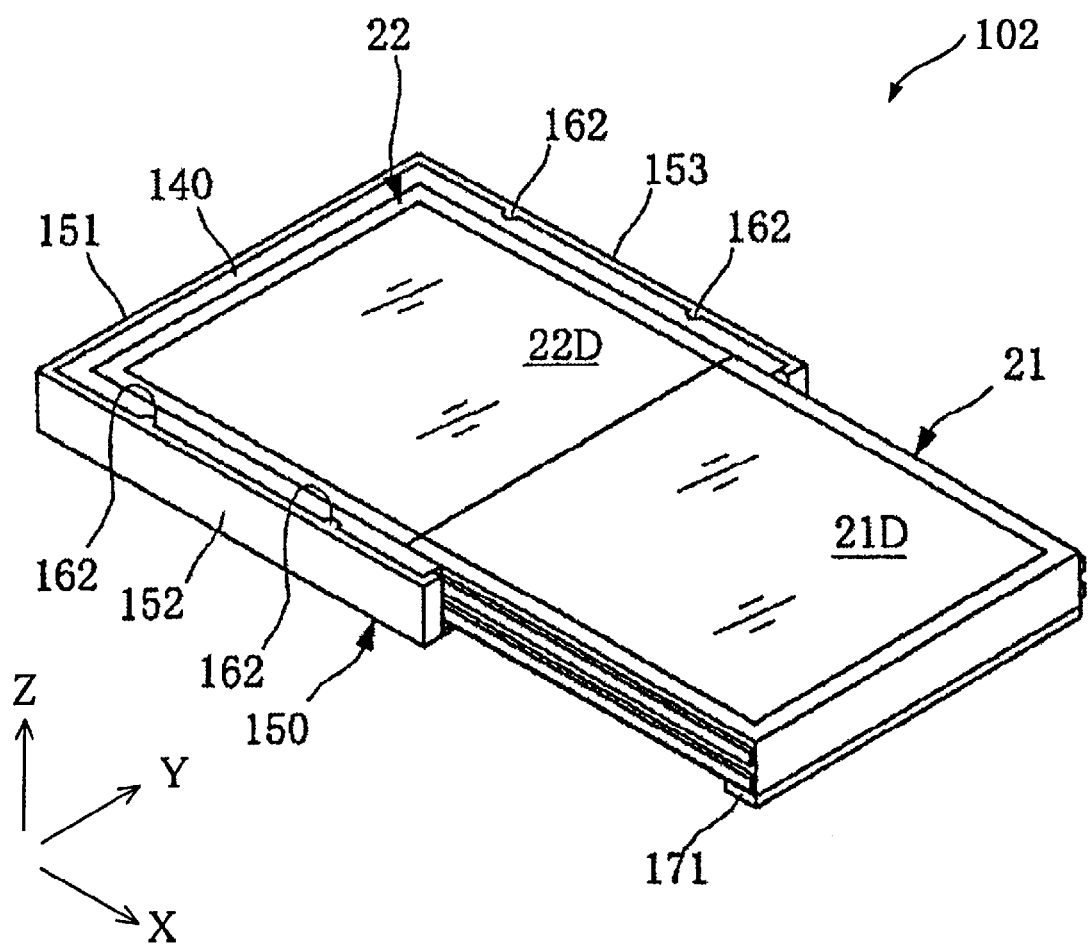
FIG. 17 is a perspective view showing the overall structure of the portable information processing device in a developed state.

In this manner, by moving the first display panel 21 in the longitudinal direction and by moving the first display panel rail unit 131 in the vertical direction, the portable information processing device 2 can be transferred between an accommodated state (see FIG. 12) and a developed state (see FIG. 17).

A manipulation for transferring the portable information processing device 2 having the above-mentioned constitution between an accommodated state (see FIG. 12) and a developed state (see FIG. 17) can be performed within a small space. Further, the manipulation for transferring the portable information processing device 2 between an accommodated state (see FIG. 12) and a developed state (see FIG. 17) can be performed only by performing the sliding movement of the first display panel 21 in the longitudinal direction as well as in the vertical direction so that the manipulation for transferring the portable information processing device 2 is extremely simple and easy. The manipulation of the portable information processing device 2 is extremely simple and easy and hence, the portable information processing device 2 can be manufactured at a low cost and, at the same time, a malfunction of the portable information processing device 2 attributed to the structure of the movement mechanism 130 or a malfunction of the portable information processing device 2 attributed to the sliding manipulation of the movement mechanism 130 minimally occurs.

As shown in FIG. 17, a protective plate 171 may be mounted on a front end of the bottom surface 21B of the second display panel 21. The protective plate 171 projects in the downward direction from the bottom surface 21B. When both the first display panel 21 and the second display panel 22 are in an accommodated state (see FIG. 12), the protective plate 171 is brought into contact with or approaches the front end surface 22DB of the second display panel 22 and hence, the protective plate 171 functions as a protective member which protects the front end surface 22DB of the second screen 22D.

The rail movement mechanism 132 may include a push lock mechanism. The push lock mechanism is configured such that when the inner casing 140 in a raised state is pushed down in the downward direction from above, the inner casing 140 is maintained in an accommodated state. The push lock mechanism is also configured such that when the inner casing 140 in an accommodated state is pushed down in the downward direction from above, the maintaining of the inner casing 140 is released and the inner casing 140 is biased toward a raised state. With the use of the push lock mechanism, the manipulation of the inner casing 140 between a raised state and an accommodated state can be easily performed. The previously-mentioned push lock mechanism 70 (see FIG. 11) may be used as such a push lock mechanism, for example.

It is needless to say that the present invention is not limited to the above-mentioned embodiments, and the addition of various modifications is conceivable without departing from the gist of the present invention.

REFERENCE SIGNS LIST 2 portable information processing device
10 casing
11 rear plate portion
12, 13 side plate portion
12G, 13G outer surface
12GM, 13GM outer groove
12GS, 13GS side surface slit
12N, 13N inner surface
14 bottom portion
14B bottom surface
14S bottom surface slit
17 protective plate
20 display unit
21, 22 display panel
21D, 22D screen
30 movement mechanism
31, 32 slide mechanism
31TA, 31TB guide projection
41, 42 accommodating area
43 neighboring area
51, 52 outer fitting plate
53 connecting plate
57 projecting portion
60 control unit

The invention claimed is:

1. A display device comprising:
a first display part having a first screen;
a second display part having a second screen;
a casing which holds the first display part and the second display part therein; and
a movement mechanism for making the first display part and the second display part movable between an overlapping state where the first screen and the second screen are held in the casing in a posture where the first screen and the second screen overlap with each other, are arranged parallel to each other and are directed in the same direction, and a developed state where the first screen and the second screen are held in the casing in a posture where the first screen and the second screen are contiguously arranged with each other,
wherein
in the overlapping state a space where the first display part is positioned is defined as a first part existing area, and a space where the second display part is positioned is defined as a second display part existing area,
in the developed state, when a space where the first display part is positioned is defined as a first display part movement destination area, and a space where the second display part is positioned is defined as a second display part movement destination area, the second display part movement destination area wholly overlaps with the first display part existing area,
in the overlapping state, the first display part is positioned in an upper portion of the casing, and the second display part is positioned in a lower portion of the casing,
the movement mechanism comprises:
a first in-plane direction rail which is provided between the casing and the first screen, and allows the first display part to move between the first display part existing area and the first display part movement destination area only by sliding of the first display part in a planar direction including the first screen; and
a second vertical direction rail which is provided between the casing and the second screen, is disposed on a side closer to the first(display part existing area than a first display part existing area side end portion of the first display part positioned in the first display part movement destination area, and allows the second display part to move between the second display part existing area and the second display part movement destination area only by sliding of the second display part in a direction perpendicular to the second screen,
the first display part and the second display part are transferred to the developed state from the overlapping state by the sliding movement of the first display part in the planar direction from the first display part existing area to the first display part movement destination area and by elevation of the second display part in the vertical direction from the second display part existing area to the second display part movement destination area, and the first in-plane direction rail does not intersect with the second vertical direction rail.

2. A display device comprising:
a first display part having a first screen;
a second display part having a second screen;
a casing which hold the first display part and the second display part therein; and
a movement mechanism for making the first display part and the second display part movable between an overlapping state where the first screen and the second screen are held in the casing in a posture where the first screen and the second screen overlap with each other, are arranged parallel to each other and are directed in the same direction, and a developed state where the first screen and the second screen are held the casing in a posture where the first screen and the second screen are contiguously arranged with each other,
wherein
in the overlapping state, a space where the first display part is positioned is defined as a first display part existing area, and a space where the second display part is positioned is defined as a second display part existing area,
in the developed state, when a space where the first display part is positioned is defined as a first display part movement destination area, and a space where the second display part is positioned is defined as a second display part movement destination area, the second display part movement destination area wholly overlaps with the first display part existing area
in the overlapping state, the first display part is positioned in an upper portion of the casing, and the second display part is positioned in a lower portion of the casing,
the movement mechanism comprises:
a first in-plane direction rail which is provided between the casing and the first screen, and allows the first display part to move between the first display part existing area and the first display part movement destination area only by sliding of the first display part in a planar direction including the first screen; and
a second vertical direction rail which is provided between the casing and the second screen, is disposed on a side closer to the first display part existing area than a first display part existing area side end portion of the first display part positioned in the first display part movement destination area, and allows the second display part to move between the second display part existing area and the second display part movement destination area only by sliding of the second display part in a direction perpendicular to the second screen,
the first display part and the second display part are transferred to the developed state from the overlapping state by the sliding movement of the first display part in the planar direction from the first display part existing area to the first display part movement destination area and by elevation of the second display part in the vertical direction from the second display part existing area to the second display part movement destination area,
the first in-plane direction rail does not intersect with the second vertical direction rail,
the first in-plane direction rail is formed on either one of the inside and the outside of the casing, and
the second vertical direction rail is formed on the other of the inside and the outside of the casing.

\* \* \* \* \*